(12) United States Patent
Cok (10) Patent No.: US 7,205,718 B2
(45) Date of Patent: *Apr. 17, 2007

(54) OLED DISPLAY HAVING THERMALLY CONDUCTIVE ADHESIVE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 213 days.

This patent is subject to a terminal disclaimer.

(21) Appl. No.: 10/876,156

(22) Filed: Jun. 24, 2004

(65) Prior Publication Data

US 2005/0285520 A1    Dec. 29, 2005

(51) Int. Cl.
*H01J 63/04* (2006.01)
(52) U.S. Cl. ...................... 313/512; 257/100
(58) Field of Classification Search ................ 313/46, 313/504, 506, 512, 511; 428/917; 315/169.3; 345/36, 45, 76; 257/98–100
See application file for complete search history.

(56) References Cited

U.S. PATENT DOCUMENTS

| | | | |
|---|---|---|---|
| 5,022,930 A | 6/1991 | Ackerman et al. | |
| 5,821,692 A | 10/1998 | Rogers et al. | |
| 5,952,778 A | 9/1999 | Haskal et al. | |
| 6,265,820 B1 | 7/2001 | Ghosh et al. | |
| 6,274,979 B1 | 8/2001 | Celii et al. | |
| 6,480,389 B1 | 11/2002 | Shie et al. | |
| 6,590,554 B1 | 7/2003 | Takayama | |
| 6,633,123 B2 | 10/2003 | Tazawa | |
| 6,641,933 B1 | 11/2003 | Yamazaki et al. | |
| 6,805,448 B2 * | 10/2004 | Yokoyama et al. | 353/85 |
| 2002/0043929 A1 | 4/2002 | Tazawa | |
| 2003/0025118 A1 | 2/2003 | Yamazaki et al. | |
| 2003/0141807 A1 | 7/2003 | Kawase | |
| 2003/0143423 A1 | 7/2003 | McCormick et al. | |
| 2003/0158294 A1 | 8/2003 | Chaudhuri et al. | |
| 2003/0203700 A1 | 10/2003 | Clark | |
| 2004/0004436 A1 | 1/2004 | Yoneda | |
| 2004/0032207 A1 | 2/2004 | Sasatani et al. | |
| 2004/0061107 A1 | 4/2004 | Duggal | |
| 2004/0079941 A1 | 4/2004 | Yamazaki et al. | |
| 2004/0094768 A1 | 5/2004 | Yu et al. | |
| 2004/0142206 A1 | 7/2004 | Bazan et al. | |
| 2004/0227139 A1 * | 11/2004 | Guenther et al. | 257/79 |

(Continued)

FOREIGN PATENT DOCUMENTS

EP     0 777 281     6/1997

(Continued)

*Primary Examiner*—Joseph Williams
*Assistant Examiner*—Bumsuk Won
(74) *Attorney, Agent, or Firm*—Andrew J. Anderson (57) ABSTRACT

An OLED device comprising: a) a substrate; b) one or more OLED light emitting elements located on the substrate and including a first electrode formed on the substrate, one or more OLED light emissive layers located over the first electrode, and a second electrode located over the OLED light emissive layers; c) an encapsulating cover located over the second electrode and affixed to the substrate; and d) a thermally-conductive adhesive material in thermal contact with and adhering the OLED light emitting elements to the encapsulating cover over the light-emitting area of the OLED light emitting elements, wherein the thermally-conductive material is more than 1 micron thick and has a thermal conductivity greater than 0.25 W/mK.

24 Claims, 4 Drawing Sheets

U.S. PATENT DOCUMENTS

2004/0247949 A1 12/2004 Akedo et al.
2005/0285518 A1 12/2005 Cok
2005/0285519 A1 12/2005 Cok

FOREIGN PATENT DOCUMENTS

| | | |
|---|---|---|
| JP | 7-111192 | 4/1995 |
| JP | 10-275681 | 10/1998 |
| JP | 11-195484 | 7/1999 |
| JP | 2001-68266 | 3/2001 |
| JP | 2003-100447 | 4/2003 |

\* cited by examiner

OLED DISPLAY HAVING THERMALLY CONDUCTIVE ADHESIVE

FIELD OF THE INVENTION

The present invention relates to organic light-emitting diode devices. In particular, the present invention relates to improving device lifetime and reducing localized non-uniformity in an OLED device due to heating within an organic light-emitting display device, and improved adhesion for an encapsulating cover.

BACKGROUND OF THE INVENTION

Organic light-emitting diode (OLED) display devices typically include a substrate having one or more OLED light-emitting elements including a first electrode formed thereon, one or more OLED light-emitting layers located over the first electrode, and a second electrode located over the OLED light-emitting layers, and an encapsulating cover located over the second electrode, affixed to the substrate, and forming a cavity between the inside of the encapsulating cover and the second electrode. Such an OLED device may be top-emitting, where the light-emitting elements are intended to emit through the cover, and/or bottom-emitting, where the light-emitting elements are intended to emit through the substrate. Accordingly, in the case of a bottom-emitting OLED device, the substrate and first electrode must be largely transparent, and in the case of a top-emitting OLED device, the cover and second electrode must be largely transparent.

Figure 3:
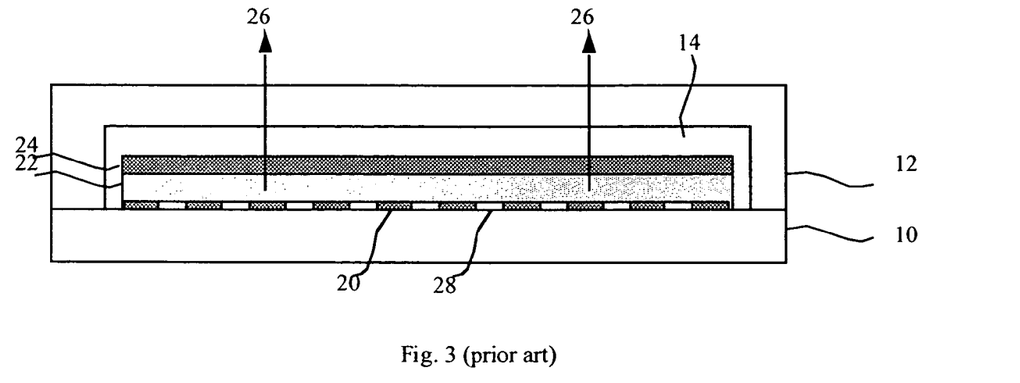
FIG. 3 is a prior-art schematic diagram of a top-emitting OLED device.

Referring to FIG. 3, a top-emitter OLED device discussed in the prior art includes a substrate 10 on which is deposited one or more first electrodes 20 separated by insulators 28, one or more organic layers 22 comprising the OLED (at least one of which is emissive when a current is passed through the layers) and a second, common electrode 24. An encapsulating cover 12 is affixed to the substrate 10 and seals the organic layers 22 from the environment. A cavity 14 exists between the second electrode 24 and the cover 12 and is usually filled with an inert gas. This cavity is typically from 10 microns to 50 microns wide, much thicker than a typical thin-film layer in an OLED device. Desiccant materials designed to protect the OLED materials may be located in the cavity, either above the light emissive area in the OLED device or around the periphery of the light emissive area in the OLED device. Thin-film protective layers (not shown) may also be deposited over the second electrode 24 and are employed to protect the second electrode 24. In this top-emitter configuration, light 26 is emitted through the cover so that the cover 12 and second electrode 24 must be transparent while the substrate 10 and the electrode 20 may be opaque or reflective.

Figure 4:
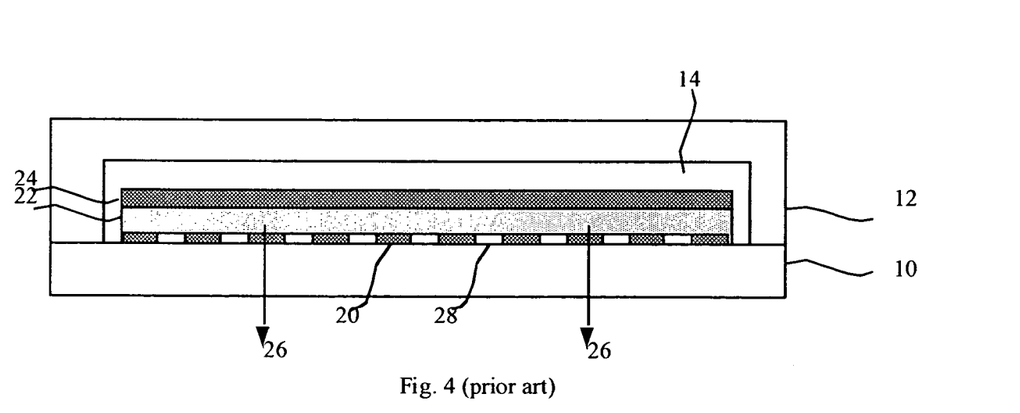
FIG. 4 is a prior-art schematic diagram of a bottom-emitting OLED device.

Referring to FIG. 4, a commercially available bottom-emitter OLED device includes a substrate 10 on which is deposited one or more first electrodes 20, one or more organic layers 22 (at least one of which is emissive when a current is passed through the layers) and a second, common electrode 24. A cover 12 is affixed to the substrate and seals the OLED materials from the environment. A cavity 14 exists between the second electrode 24 and the cover 12 and is usually filled with an inert gas and may include desiccant materials. In this bottom-emitter configuration light 26 is emitted through the substrate 10 so that the substrate 10 and first electrode 20 must be transparent while the cover 12 and the second electrode 24 may be opaque or reflective.

A variety of materials may be used to construct suitable substrates and encapsulating covers for OLED devices and to fill the cavity between the second electrode and the cover. The desirable material properties and/or characteristics of an OLED substrate and cover include low cost, very flat surface, low coefficient of thermal expansion (CTE), high strength and stability under a variety of environmental stresses, and electrically non-conductive (or able to be coated with electrically non-conductive material). The material used most often for such substrates is glass, typically borosilicate glass, because it is transparent, very stable, can be made at low-cost, and has a very smooth surface suitable for the deposition and processing of semiconductor and organic materials. Other substrate materials have been described in the art, for example ceramics, plastics, and metals such as stainless steel (see U.S. Pat. No. 6,641,933 B1 to Yamazaki et al entitled "Light-emitting EL display device"). Because the OLED materials are very sensitive to moisture, the cavity between the second electrode and the cover is often provided with desiccant materials and the cover is carefully sealed to the substrate (see, e.g., US 20030203700 A1 entitled "Encapsulating OLED devices with transparent cover" by Clark published 2003 Oct. 30). Inert gases may be employed to fill the cavity; alternatively, it is known to provide polymer material to fill the cavity (see, for example, US 20030143423 A1 entitled "Encapsulation of organic electronic devices using adsorbent loaded adhesives" by McCormick, et al published 2003 Jul. 31).

JP 10-275681 discloses an organic electroluminescent light source having a light emitting element with a relatively thick cathode and a surrounding conforming protecting resin layer to provide high heat conductivity. However, as described for this arrangement, there is no disclosure of use of such surrounding protecting layer to adhere a separate encapsulating cover to the organic electroluminescent light source. The use of conforming resin protection layer, however, typically is inadequate itself to provide desired environmental protection to the organic electroluminescent materials. Further, there is no disclosure of the need to spread heat between an active light emitting element and an inactive light emitting element in a device comprising a plurality of light emitting elements, in order to reduce differential aging of such light emitting elements.

Organic light-emitting diodes can generate efficient, high-brightness displays. However, heat generated during the operation of the display in high-brightness modes can limit the lifetime of the display, since the light-emitting materials within an OLED display degrade more rapidly when used at higher temperatures. While it is important to maintain the overall brightness of an OLED display, it is even more important to avoid localized degradation within a display. The human visual system is acutely sensitive to differences in brightness in a display. Hence, differences in uniformity are readily noticed by a user. Such localized differences in uniformity in an OLED display may occur as a consequence of displaying static patterns on the display, for example, graphic user interfaces often display bright icons in a static location. Such local patterns will not only cause local aging in an OLED display, but will also create local hot spots in the display, further degrading the light-emitting elements in the local pattern. Glass and plastic supports, the use of which is advantageous in view of their relative electrical non-conductivity, may not be sufficiently thermally conductive to provide a uniform temperature across the substrate when the display is in operation. Hence, improved thermal management techniques may significantly improve the life expectancy of an organic display device.

One method of removing heat from an organic light emitting display device is described in U.S. Pat. No. 6,265,820, entitled, "Heat removal system for use in organic light emitting diode displays having high brightness." The '820 patent describes a heat removal system for use in organic light emitting diode displays. The heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device. While the system of the '820 patent in one embodiment provides a thermally conductive intermediate material positioned between the organic light emitting device and a sealed backplate, the use of specific materials suggested (metallic layers or non-metallic thermal paste) do not provide adhesion or are difficult to assemble in OLED devices. Moreover, the structure described in the '820 patent is complex, requiring multiple layers.

U.S. Pat. No. 6,480,389 to Shie et al entitled "Heat dissipation structure for solid-state light emitting device package" describes a heat dissipation structure for cooling inorganic LEDs and characterized by having a heat dissipating fluidic coolant filled in a hermetically sealed housing where at least one LED chip mounted on a metallic substrate within a metallic wall erected from the metallic substrate. Such an arrangement is complex, requires fluids, and is not suitable for area emitters such as OLEDs.

US 2004/0004436 A1 entitled "Electroluminescent display device" by Yoneda published Jan. 8, 2004, describes an organic EL panel having a device glass substrate provided with an organic EL element on a surface thereof, a sealing glass substrate attached to the device glass substrate, a desiccant layer formed on a surface of the sealing glass substrate, and nonadhesive (e.g., metal) spacers disposed between a cathode of the organic EL element and a desiccant layer. A heat-conductive layer can be formed by vapor-depositing or sputtering a metal layer such as a Cr layer or an Al layer that inhibits damaging the organic EL element and increases a heat dissipating ability, thereby inhibiting aging caused by heat.

U.S. Pat. No. 6,633,123 B2 entitled "Organic electroluminescence device with an improved heat radiation structure" issued 2003 Oct. 14 provides an organic electroluminescence device including a base structure and at least an organic electroluminescence device structure over the base structure, wherein the base structure includes a substrate made of a plastic material, and at least a heat radiation layer which is higher in heat conductivity than the substrate.

U.S. Pat. No. 5,821,692 A entitled "Organic electroluminescent device hermetic encapsulation package" issued 1998 Oct. 13 describes an organic electroluminescent device array encapsulating package including an organic electroluminescent device on a supporting substrate. A cover having a rim engaging the supporting substrate is spaced from and hermetically encloses the organic electroluminescent device. A dielectric liquid having benign chemical properties fills the space between the cover and the organic electroluminescent device, providing both an efficient medium for heat transmission and an effective barrier to oxygen and moisture. Similarly, JP11195484 A entitled "Organic EL Element" by Yasukawa et al. published 1999 Jul. 21 describes an organic EL element equipped with an organic EL structural body laminated on a substrate, and a sealing plate arranged on the organic EL structural body with a predetermined gap, where a sealing substance having heat conductivity of $1.1 \times 10^{-1}$ W·m$^{-1}$·K$^{-1}$ or more, and viscosity of 0.5 to 200 cP at 25° C. is filled in the sealed space. While such dielectric liquids can be useful, applicant's experience with such materials is that they are difficult to use in manufacturing. Moreover, if the substrate and cover of an OLED device have significantly differing coefficients of thermal expansion and the OLED device is heated, the materials cited do not provide additional adhesion that may be necessary to prevent the seal between the cover and the substrate from breaking.

JP2003100447 A entitled "Organic Electroluminescence Equipment" by Hashimoto et al. published 2003 Apr. 4 describes a high sealing resin layer and a high heat-conductivity resin layer formed in the gap of a glass substrate and a sealing substrate in the perimeter part of the sealing substrate. Such a layer does not assist in removing or spreading heat from the emissive areas of the OLED device, and also does not improve adhesion to the cover in such emissive areas.

Heat sinks are also well known in the integrated circuit industry and are applied to cooling large integrated circuits. Such sinks typically are thick and are unsuitable for displays in which limiting the thickness of the display is an important goal. Moreover, heat sinks do not improve the thermal conductivity of an OLED device itself.

It is therefore an object of the present invention to provide a more uniform distribution of heat within an OLED display to improve the removal of heat from an OLED display device thereby increasing the lifetime of the display, and to improve adhesion of an encapsulating cover in an OLED device.

SUMMARY OF THE INVENTION

In accordance with one embodiment, the invention is directed towards an OLED device comprising: a) a substrate; b) one or more OLED light emitting elements located on the substrate and including a first electrode formed on the substrate, one or more OLED light emissive layers located over the first electrode, and a second electrode located over the OLED light emissive layers; c) an encapsulating cover located over the second electrode and affixed to the substrate; and d) a thermally-conductive adhesive material in thermal contact with and adhering the OLED light emitting elements to the encapsulating cover over the light-emitting area of the OLED light emitting elements, wherein the thermally-conductive material is more than 1 micron thick and has a thermal conductivity greater than 0.25 W/mK.

DETAILED DESCRIPTION OF THE INVENTION

Figure 1:
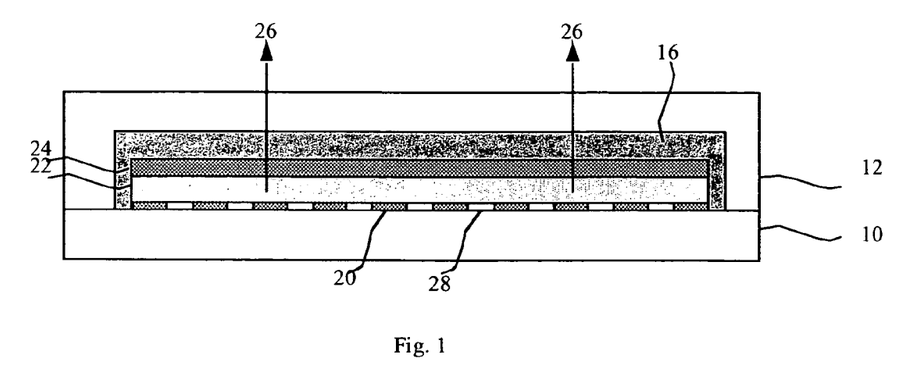
FIG. 1 is a schematic diagram of a top-emitting OLED device according to one embodiment of the present invention.

Referring to FIG. 1, a top-emitter embodiment of the present invention includes a substrate 10 on which is deposited one or more OLED light-emitting elements comprising first electrodes 20 separated by insulators 28, one or more organic layers 22 (at least one of which is emissive when a current is passed through the layers) and a second, common electrode 24. A cover 12 is affixed to the substrate and seals the OLED materials from the environment. A thermally conductive adhesive material 16 is located in thermal contact with the second electrode 24 of the light-emitting elements and the encapsulating cover 12. An adhesive material used in accordance with the present invention is one that requires force to detach the encapsulating cover from the adhesive material. The thermally conductive adhesive material has a conductivity greater than 0.25 W/mK, more preferably greater than or equal to 1.0, and a thickness of greater than 1 micron, i.e. the thermally conductive adhesive material is not a thin-film and preferably fills the cavity between the second electrode 24 and the cover 12. Second electrode 24 may comprise a single conductive layer, or may comprise multiple conductive layers or a combination of conductive and protective layers. Thermal contact between the thermally conductive material and the light-emitting elements and cover is established when heat flows readily between the thermally conductive material and the OLED light-emitting elements and the cover over the entire light emitting area of the OLED light-emitting elements. In the top-emitter configuration shown in FIG. 1, light 26 is emitted through the cover so that the cover 12, second electrode 24, and the thermally conductive adhesive material 16 must be transparent while the substrate 10 and the electrode 20 may be opaque or reflective.

Figure 2:
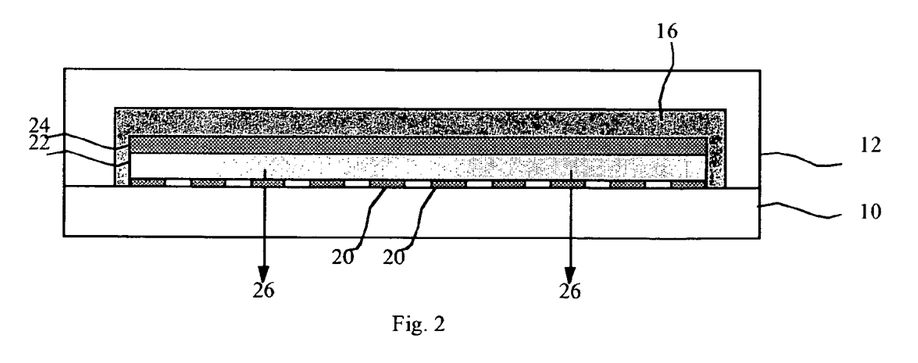
FIG. 2 is a schematic diagram of a bottom-emitting OLED device according to an embodiment of the present invention.

Referring to FIG. 2, a complementary bottom-emitter embodiment of the present invention includes a substrate 10 on which is deposited one or more OLED light-emitting elements comprising first electrodes 20, one or more organic layers 22 (at least one of which is emissive when a current is passed through the layers) and a second, common electrode 24. A cover 12 is affixed to the substrate and seals the OLED materials from the environment. A thermally conductive adhesive material 16 is in thermal contact with the second electrode 24 of the light-emitting elements and the cover 12. In this bottom-emitter configuration, light is emitted through the substrate 10 so that the substrate 10 and first electrode 20 must be transparent while the cover 12, the second electrode 24, and the thermally conductive adhesive material 16 may be opaque or reflective.

In a particular embodiment, the OLED device may include a plurality of OLED light emitting elements located on the substrate, where each light emitting element includes a first patterned electrode formed over the substrate and one or more OLED light emissive layers located over the first electrode, and a second electrode layer located over the plurality of OLED light emitting elements. In such embodiment, there will typically be a patterned insulating layer between the patterned electrodes. Where a plurality of OLED elements are present, the thermally conductive adhesive material preferably has a continuous thickness greater than 1 micron over and between the plurality of light emitting elements, to facilitate spreading of heat from an active element to an inactive element.

The thermally conductive adhesive material 16 may be any adhesive material that can be deposited or inserted into the cavity 14 (shown in FIGS. 3 and 4), for example, adhesive polymers, epoxies, and silicones, and having a thermal conductivity greater than 0.25 W/mK and a thickness greater than 1 micron. Conventional adhesives with a thermal conductivity of 0.25 W/mK or less are not suitable when used alone, while composite conductive adhesives made of an adhesive first material with the addition of a heat conducting second material having a thermal conductivity greater than that of the first material may provide an overall thermal conductivity of greater than 0.25 W/mK are suitable. Additives such as metallic or ceramic particles and nano-materials including metallic or carbon components may be employed. Adhesive polymers having special formulations providing thermal conductivity may be employed, for example thermally conductive tapes with a thermal conductivity greater than 0.25 W/mK available from the 3M Company (e.g., 3M 9882). Thermally conductive epoxy adhesive materials are preferred. Specific commercially available thermally conductive adhesive materials include, e.g. OmegaBond 101 (thermal conductivity 1.04 W/mK).

Preferably, the thermally conductive adhesive material fills the cavity between the light-emitting elements and the cover at least over the light-emitting area of the OLED device. Thermally conductive adhesive materials can be applied in liquid form and may be cured to form a thermally conductive adhesive solid. Curing may be accomplished, for example, by heat or UV exposure. Preferable, curing is accomplished at temperatures below 120° C. to avoid heat damage to OLED materials. Liquid application has the advantage that a liquid readily conforms to the volume and shape needed.

In operation, OLED devices are provided with a voltage differential across the electrodes by an external power supply (not shown). The voltage differential causes a current to flow through the OLED materials causing the OLED materials to emit light. However, the conversion of current to light is relatively inefficient, so that much of the energy is converted to heat. Moreover, much of the emitted light does not escape from the OLED device and is reabsorbed into the device as heat. Hence, OLED devices can become very hot and operate at temperatures well in excess of ambient temperatures. For example, in an ambient environment of 20° C., applicants have demonstrated that an OLED may operate at 40° C. to 60° C. or even, at very high brightnesses, in excess of 100° C. This heat is detrimental to the OLED device. As is well known, OLED materials degrade as they are used and degrade faster at higher temperatures. Therefore, providing improved heat management to cool an OLED device improves the lifetime of the OLED device.

In a conventional, prior-art OLED device (as shown in FIGS. 3 and 4), the heat generated within the OLED layers 22 must pass through the electrodes before it can escape from the OLED device. Some of the heat can pass through the first electrode 20 and thence through the substrate 10 while some of the heat passes through the second electrode 24, the cavity 14, and the encapsulating cover 12. The thermal conductivity of the cavity 14 may be 0.025 W/mK (if filled with air) or 0.20 W/mK for conventional epoxy materials (e.g., Optocast 3505) as described in the prior art. All of these materials represent a significant thermal barrier to heat escaping through the cover 12. The second electrode 24 is typically made of metal (for example silver or aluminum) or a metal oxide (for example, indium tin oxide) or metal alloys. These electrode materials are relatively good conductors of heat. Unfortunately, the electrodes are typically thin films, for example 2–200 nm thick. Applicant has demonstrated that such thin films of metals do not provide significant heat conductivity.

Figure 5:
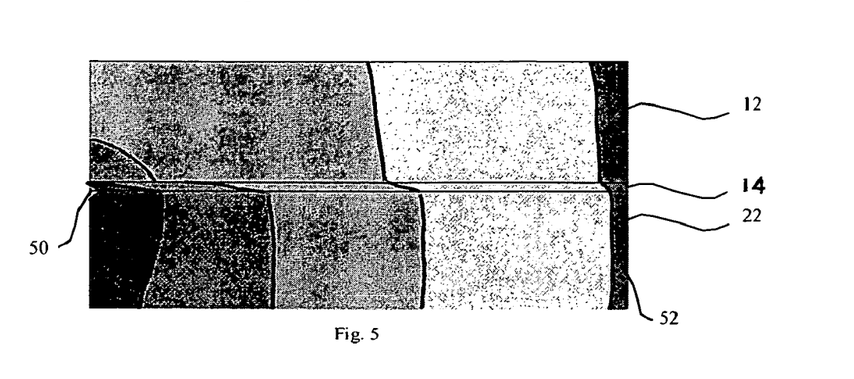
FIG. 5 is a diagram illustrating the heat flow of a top-emitting OLED display as shown in FIG. 3.

Referring to FIG. 5, a thermal model of the prior-art OLED shown in FIG. 3 is illustrated. In this structure, as shown in FIG. 3, a transparent glass substrate 22 (700 microns thick) is encapsulated by a glass cover 12 (also 700 microns thick). A 50-micron air-filled cavity 14 is provided to simulate the cavity which may be present in OLED devices between the second electrode 24 and the encapsulating cover 12. Energy is applied to a single point 50 on the transparent substrate 10. The applied energy raises the temperature of the point to 60° C. Similarly shaded areas in FIG. 5 represent areas within a band of the same approximate temperature. At the opposite end of the substrate and cover, a temperature band 52 has a temperature of 37° C.

Figure 6:
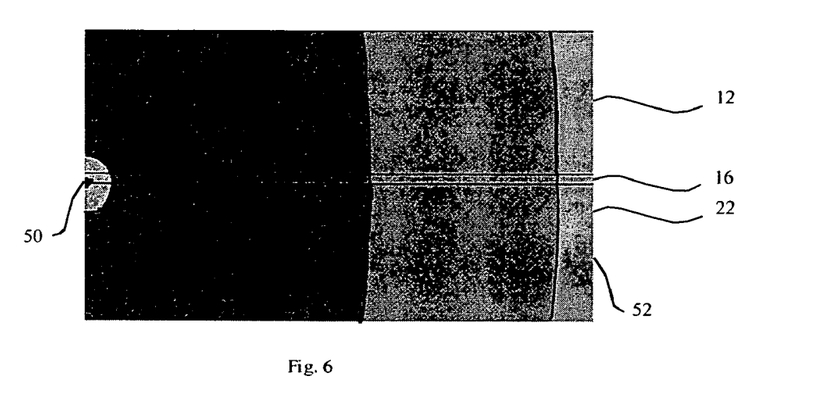
FIG. 6 is a diagram illustrating the heat flow of an OLED device according to an embodiment of the present invention.

As illustrated in FIG. 6, the use of a 50-micron layer of thermally conductive adhesive material 16 in place of air gap 14 significantly reduces the heat, and hence the aging, of the OLED device at point 50. In this case, the thermally conductive adhesive material is OmegaBond 101 with a thermal conductivity of 1.04 W/mK. As can be seen from this model, the temperature at point 50 is reduced to 53° C.

The heat conductive materials 16 may include desiccant materials and may also provide environmental protection to the OLED device, particularly from moisture. Moreover, it is helpful if the heat conductive materials 16 have a coefficient of thermal expansion that is matched to the cover 12, substrate 10, or the OLED materials 22 or electrodes 20 and 24. In a preferred embodiment, the heat conductive materials 16 have some flexibility to reduce stress from differential thermal expansion in the OLED device. Where the coefficients of thermal expansions of the Substrates and cover themselves are not closely matched, the use of a thermally conductive adhesive in accordance with the invention will advantageously assist in maintaining a bond between the substrate and cover in the presence of heat.

According to the present invention, the substrate 10 or cover 12 may be either rigid or flexible, as may the heat conductive materials 16. Suitably thin layers of either metals or glasses may be used for the substrate or cover. In particular, flexible plastics may be employed. Since flexible plastic materials do not effectively seal an OLED display from environmental gases or liquids, the thermally conductive adhesive material 16 may provide additional protection to the OLED device from the environment. If the thermally conductive adhesive material is compressible, stresses applied to the OLED device, particularly for flexible displays, are accommodated without stressing the OLED layers, electrodes, or encapsulation mechanism. Alternatively, as with cured epoxies, the thermally conductive adhesive may be a rigid solid that can provide strength to the OLED device. Conformability of the thermally conductive adhesive material when deposited is useful to provide good thermal contact to both the second electrode and the cover. Moreover, applicants have discovered through experimentation that a flexible material in the cavity may reduce shorts in the OLED layers.

Figure 7:
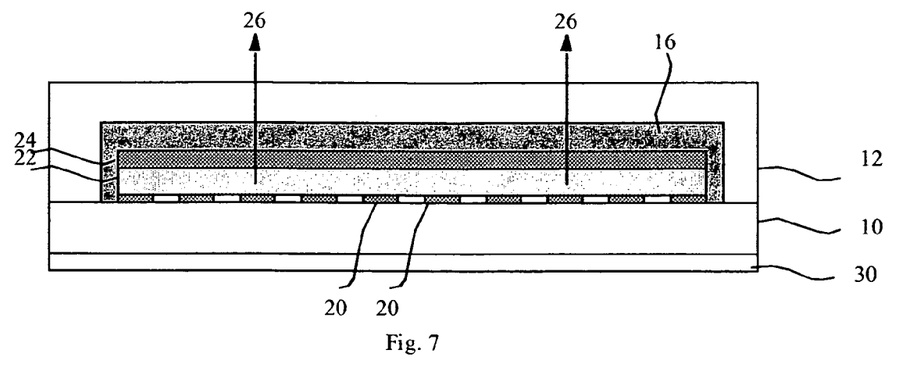
FIG. 7 is a schematic diagram of a top-emitting OLED device according to an alternative embodiment of the present invention.
Figure 8:
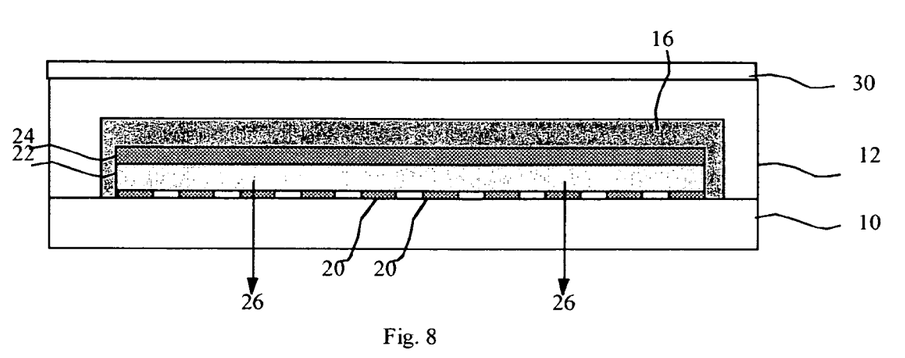
FIG. 8 is a schematic diagram of a bottom-emitting OLED device according to an alternative embodiment of the present invention.
Figure 9:
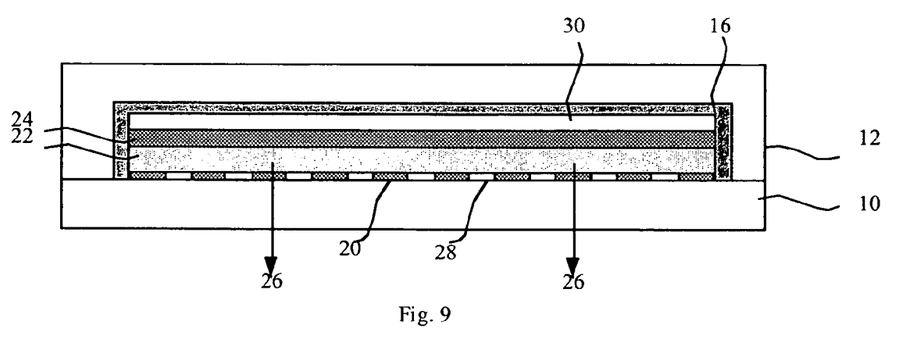
FIG. 9 is a schematic diagram of a bottom-emitting OLED device according to an alternative embodiment of the present invention.
Figure 10:
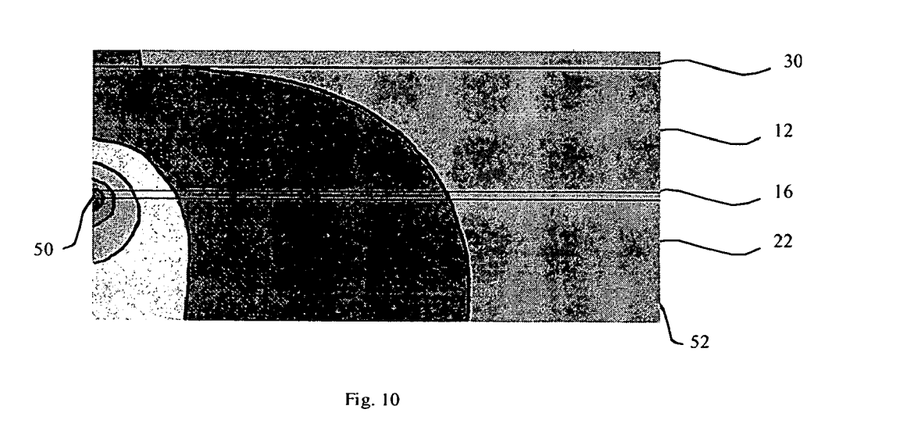
FIG. 10 is a diagram illustrating the heat flow of an OLED device according to an alternative embodiment of the present invention.

Referring to FIGS. 7 and 8 in top- and bottom-emitter configurations respectively, additional heat conductive coatings 30 may be employed on the outside of the substrate or cover to further conduct heat away from the OLED materials 14. Suitable coatings include metals, for example 100-micron coatings of Al. Referring to FIG. 9, thin-film heat conductive layers 30 may also be employed between the second electrode 24 and the inside of the cover 12, for example over the second electrode 24, as shown, or on the inside of the cover 12 (not shown). However, such layers are typically much less than 1 micron thick, do not fill the cavity between the second electrode and the cover, and are not in thermal contact with both the second electrode 24 and cover 12. FIG. 10, illustrates the improvement that may be obtained by employing an additional thermally conductive layer on the outside of the encapsulating cover. Referring to FIG. 10, the addition of a 100-micron thick thermally conductive layer 30 of aluminum and using the same thermally conductive adhesive material as in FIG. 6 reduces the temperature of point 50 to 36° C.

Heat may additionally be removed from the OLED display of the present invention by using conventional heatsinks in thermal contact with any external layers, for example by locating such heat sinks on the outside of the substrate (for top-emitter OLEDs) or the outside of the cover (for bottom-emitter OLEDs) either in the center of the OLED device or at the edges. When used within an appliance, the appliance may be placed in thermal contact with OLED device, especially in combination with the use of thermally conductive layers on the outside of the OLED device as described above.

The invention has been described in detail with particular reference to certain preferred embodiments thereof, but it will be understood that variations and modifications can be effected within the spirit and scope of the invention. Accordingly, the preferred embodiments of the invention as described in reference to FIGS. 1, 2, 7, 8, and 9 are intended to be illustrative, not limiting.

PARTS LIST

10 substrate
12 encapsulating cover
14 cavity
16 thermally conductive adhesive
20 first electrode
22 OLED layers
24 second electrode
26 light
28 insulator
30 heat conductive coating
50 energy application point
52 temperature band

What is claimed is:

1. An OLED device comprising:
   a) a substrate;
   b) one or more OLED light emitting elements located on the substrate and including a first electrode formed on the substrate, one or more OLED light emissive layers located over the first electrode, and a second electrode located over the OLED light emissive layers;
   c) an encapsulating cover located over the second electrode and affixed to the substrate; and
   d) a thermally-conductive adhesive material in thermal contact with and adhering the OLED light emitting elements to the encapsulating cover over the light-emitting area of the OLED light emitting elements, wherein the thermally-conductive material is more than 1 micron thick and has a thermal conductivity greater than 0.25 W/mK.

2. The OLED device claimed in claim 1 wherein the thermally-conductive adhesive material is an epoxy.

3. The OLED device claimed in claim 1 wherein the thermally-conductive adhesive material is a silicone.

4. The OLED device claimed in claim 1 wherein the thermally-conductive adhesive material is transparent.

5. The OLED device claimed in claim 1 wherein the thermally-conductive adhesive material has desiccating properties.

6. The OLED device claimed in claim 1 wherein the thermally-conductive adhesive material includes an adhesive first material and particles of a thermally-conductive second material distributed through the adhesive first material and having a thermal conductivity higher than the thermal conductivity of the adhesive first material.

7. The OLED device claimed in claim 6 wherein the thermally-conductive second material is a metal, a metal alloy, a glass, and/or a ceramic.

8. The OLED device claimed in claim 6 wherein the thermally-conductive second material includes nano-particles.

9. The OLED device claimed in claim 6 wherein the adhesive first material is an epoxy and the thermally-conductive second material is a glass.

10. The OLED device claimed in claim 9 wherein the glass particles are glass beads.

11. The OLED device claimed in claim 1 wherein the thermally-conductive adhesive material has a coefficient of thermal expansion matched to the cover of the device.

12. The OLED device claimed in claim 1 wherein the thermally-conductive adhesive material is deposited as a liquid and is cured to form an adhesive solid.

13. The OLED device claimed in claim 1 wherein the OLED device is a top-emitting device and the cover and thermally-conductive material are transparent.

14. The OLED device claimed in claim 13 wherein the substrate has a thermal conductor located on the substrate on the side of the substrate opposite the OLED light emitting elements.

15. The OLED device claimed in claim 1 wherein the OLED device is a bottom-emitting device and the substrate is transparent.

16. The OLED device claimed in claim 15 wherein the encapsulating cover has a thermal conductor located on the inside of the cover.

17. The OLED device claimed in claim 15 wherein the encapsulating cover has a thermal conductor located on the outside of the cover.

18. The OLED device claimed in claim 1 wherein the thermally-conductive adhesive material is flexible.

19. The OLED device claimed in claim 1 wherein the substrate or cover is flexible.

20. The OLED device claimed in claim 1 wherein the thermally-conductive adhesive material acts as a barrier layer to prevent the passage of gas or liquids through the material.

21. The OLED device claimed in claim 1 wherein the thermally-conductive adhesive material fills the space between the encapsulating cover and the OLED light-emitting elements.

22. The OLED device claimed in claim 1 wherein the OLED light-emitting elements further comprise protective or conductive layers located on the second electrode.

23. The OLED device claimed in claim 1 wherein the thermally-conductive adhesive material has a thermal conductivity greater than 1.0 W/mK.

24. The OLED device claimed in claim 1 comprising a plurality of OLED light emitting elements located on the substrate, where each light emitting element includes a first patterned electrode formed over the substrate and one or more OLED light emissive layers located over the first electrode, and a second electrode layer located over the plurality of OLED light emitting elements, wherein the thermally conductive adhesive material has a continuous thickness greater than 1 micron over and between the plurality of light emitting elements.

* * * * *